(12) United States Patent
Rao et al.

(10) Patent No.: US 7,528,047 B2
(45) Date of Patent: May 5, 2009

(54) SELF-ALIGNED SPLIT GATE MEMORY CELL AND METHOD OF FORMING

(75) Inventors: Rajesh A. Rao, Austin, TX (US); Tushar P. Merchant, Austin, TX (US); Ramachandran Muralidhar, Austin, TX (US); Lakshmanna Vishnubhotla, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 130 days.

(21) Appl. No.: 11/759,593

(22) Filed: Jun. 7, 2007

(65) Prior Publication Data
US 2008/0303094 A1 Dec. 11, 2008

(51) Int. Cl.
*H01L 21/336* (2006.01)
(52) U.S. Cl. ............... 438/303; 438/266; 438/267; 257/E21.04; 257/E21.645
(58) Field of Classification Search ........ 257/314, 257/315, 365, E21.04, E29.17, E21.645; 438/267, 261, 257, 266, 303, 197
See application file for complete search history.

(56) References Cited
U.S. PATENT DOCUMENTS
6,417,049 B1 * 7/2002 Sung et al. ............... 438/266
6,855,979 B2 * 2/2005 Sadd et al. ............... 257/319
7,115,476 B1 * 10/2006 Izumida ................... 438/268
2006/0202255 A1 * 9/2006 Jeon et al. ............... 257/315
2007/0176223 A1 * 8/2007 Chindalore et al. ...... 257/314

* cited by examiner

*Primary Examiner*—Lisa M Caputo
*Assistant Examiner*—Duy T Nguyen
(74) *Attorney, Agent, or Firm*—Robert L. King; James L. Clingan, Jr.

(57) ABSTRACT

A method of forming a split gate memory device using a semiconductor layer includes patterning an insulating layer to leave a pillar thereof. A gate dielectric is formed over the semiconductor layer. A charge storage layer is formed over the gate dielectric and along first and second sides of the pillar. A gate material layer is formed over the gate dielectric and pillar. An etch is performed to leave a first portion of the gate material laterally adjacent to a first side of the pillar and over a first portion of the charge storage layer that is over the gate dielectric to function as a control gate of the memory device and a second portion of the gate material laterally adjacent to a second side of the pillar and over a second portion of the charge storage layer that is over the gate dielectric to function as a select gate.

16 Claims, 6 Drawing Sheets

SELF-ALIGNED SPLIT GATE MEMORY CELL AND METHOD OF FORMING

CROSS-REFERENCE TO RELATED APPLICATION

This application is related to U.S. patent application Ser. No. 11/759,518, filed on even date, entitled "Split Gate Memory Cell Using Sidewall Spacers" naming Rajesh Rao, Tushar Merchant, Ramachandran Muralidhar, and Lucky Vishnubhotla as inventors, and assigned to the current assignee hereof.

BACKGROUND

1. Field

This disclosure relates generally to semiconductor device manufacturing, and more specifically, to the manufacture of non-volatile memories having a split gate.

2. Related Art

Non-volatile memories (NVMs) have many important uses in combination with other circuitry, especially when electrical power is not present. The use of non-volatile memories is particularly advantageous for power savings applications or when power is interrupted. Primarily, NVMs are implemented by using floating gate transistors, but floating gate transistors have limitations, especially as geometries have gotten smaller. If there is any current leakage path, regardless of how localized, to the floating gate, stored electrical charge can be completely removed from the floating gate. Thus, nanocrystals and nitride as the storage layer have become of more interest because one leakage path does not discharge the entire storage layer. One of the structures that has been shown to have much promise for programming efficiency is a split gate memory cell using source side injection in which both a control gate and a select gate influence the channel but only the control gate ever has the higher voltage needed for programming and erasing.

Known split-gate memory cell devices use two gates. A first gate is a control gate to control the program and erase operations. A second gate is a select gate to select when the memory bit is to be programmed. Such known split-gate memory cells are therefore bigger than single gate memory devices. Therefore, it is difficult to reduce dimensions of the structures that are used to implement known split-gate memory cells to take advantage of improvements in processing technology.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
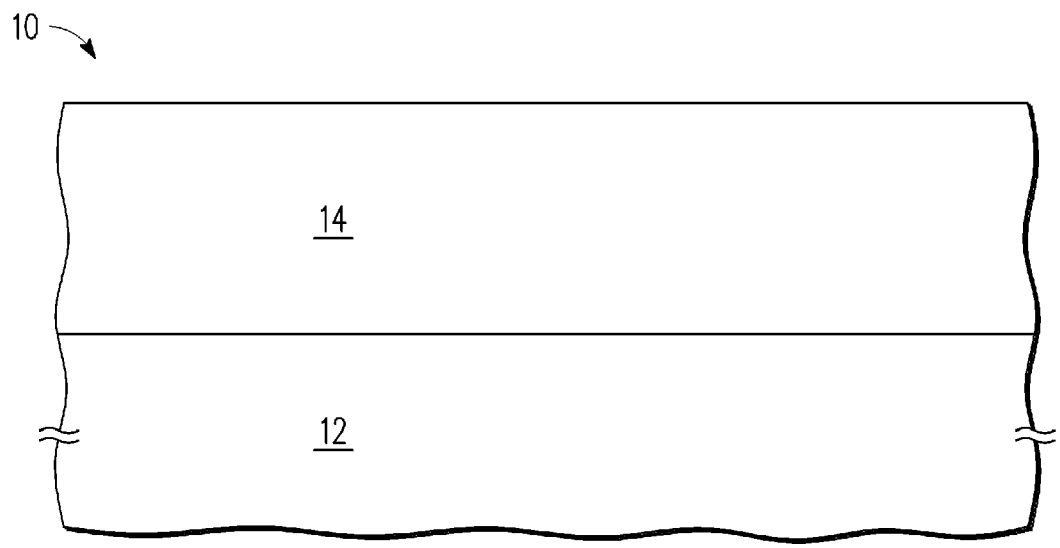
FIGS. 1-12 illustrate in cross-sectional form a semiconductor device structure in accordance with the present invention.

Illustrated in FIG. 1 is a semiconductor device 10 that, when completed, is a dual gate or split gate memory cell. Semiconductor device 10 has a semiconductor substrate 12. The semiconductor substrate 12 is preferably silicon but could be any semiconductor layer formed of a different semiconductor material. In the illustrated form semiconductor substrate 12 is shown as bulk silicon. Semiconductor substrate 12 could also be a semiconductor-on-insulator (SOI) type substrate. The semiconductor substrate 12 described herein can be any semiconductor material or combinations of materials, such as gallium arsenide, silicon germanium, silicon-on-insulator (SOI), silicon, monocrystalline silicon, the like, and combinations of the above. A thermal oxide 14 is grown on the semiconductor substrate 12 by a wet oxidation process or a conventional insitu steam generation (ISSG) process. The thermal oxide 14 is grown to a depth that is relatively significant. By way of example, in one form the thermal oxide 14 is formed to have a depth or thickness anywhere in a range of 500 to 1,500 Angstroms. Other depths could be implemented as it is important that the thermal oxide 14 have a depth sufficient to be subsequently etched and maintain a height sufficient for the height of a memory cell.

Figure 2:
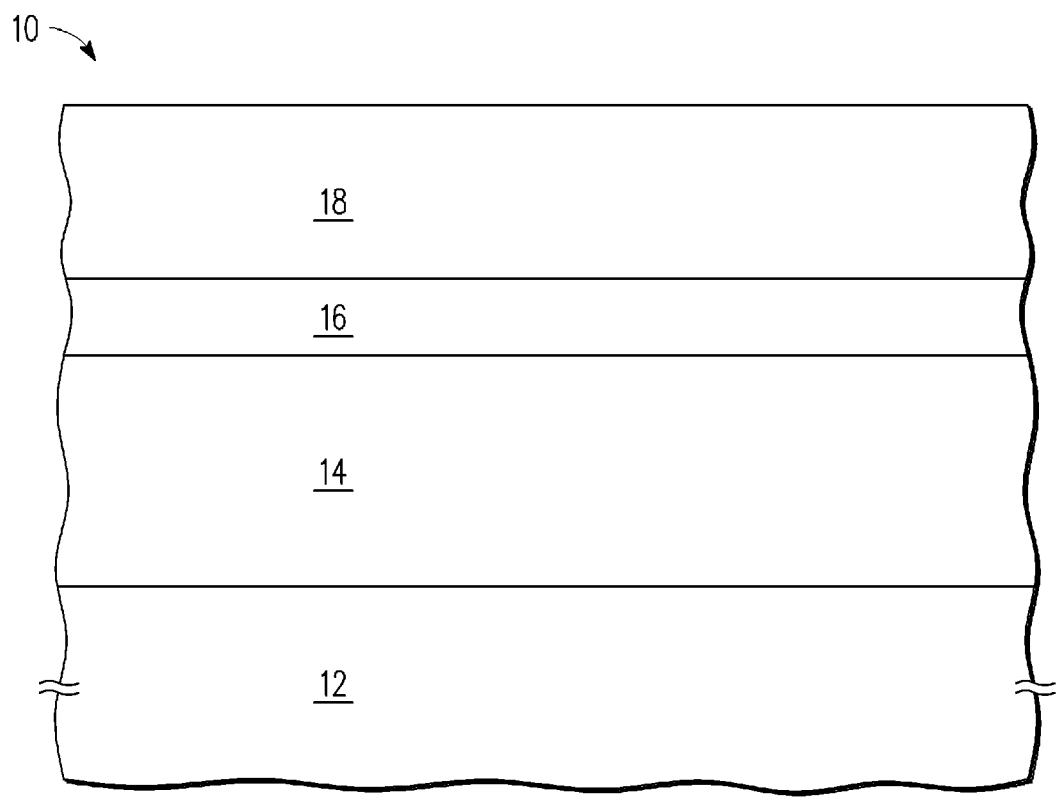

Illustrated in FIG. 2 is further processing of semiconductor device 10. A layer of polysilicon 16 is deposited overlying the thermal oxide 14. The layer of polysilicon 16 is conformal and is deposited to have a thickness approximately in a range of 300 to 500 Angstroms. It should be apparent however that other thicknesses could be used. Overlying the layer of polysilicon 16 is a deposited layer of photoresist 18. The photoresist 18 is a conformal layer that is on the layer of polysilicon 16.

Figure 3:
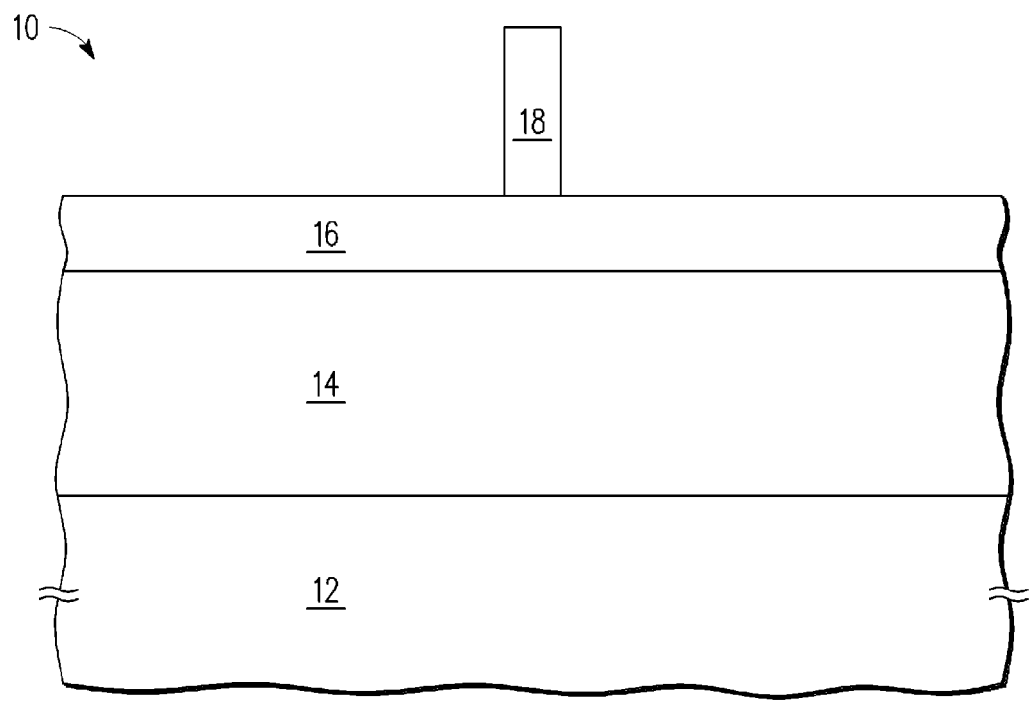

Illustrated in FIG. 3 is further processing of semiconductor device 10 wherein the layer of photoresist 18 is patterned using a conventional photolithography process. This processing is followed by a thinning process that is referred to as trimming the remaining portion of the photoresist 18. The trimming of the photoresist 18 is performed by using an oxygen plasma with optional halogen such as $CF_4$, $Cl_2$ or HBr in an inductively coupled plasma etcher. This trimming removes the photoresist isotropically such that the location of the remaining portion of photoresist 18 is physically central to a non-volatile memory cell.

Figure 4:
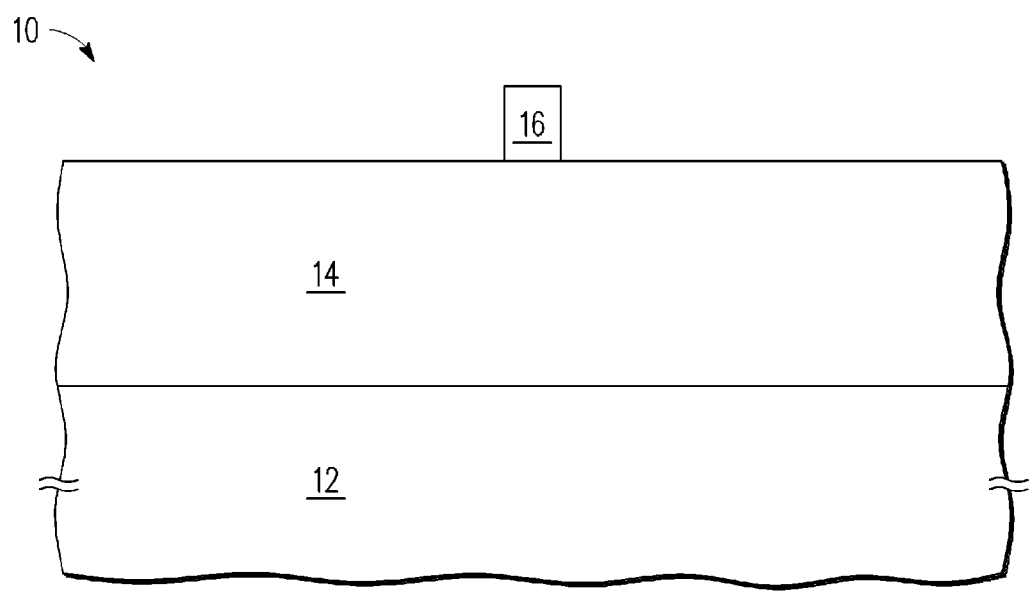

Illustrated in FIG. 4 is further processing of semiconductor device 10. The thinning of the remainder of the photoresist 18 functions to provide a mask feature overlying the layer of polysilicon 16 and has very small width and sufficient depth to prevent the etching of underlying portions of the layer of polysilicon 16. The exposed layer of polysilicon 16 is removed using a conventional dry etch. Subsequently, the remainder of the photoresist 18 is removed thereby resulting in the structure illustrated in FIG. 4. It should be noted that the remaining portion of polysilicon 16 has a width that is extremely small as a result of this processing. However, the dimensions may be made even smaller.

Figure 5:
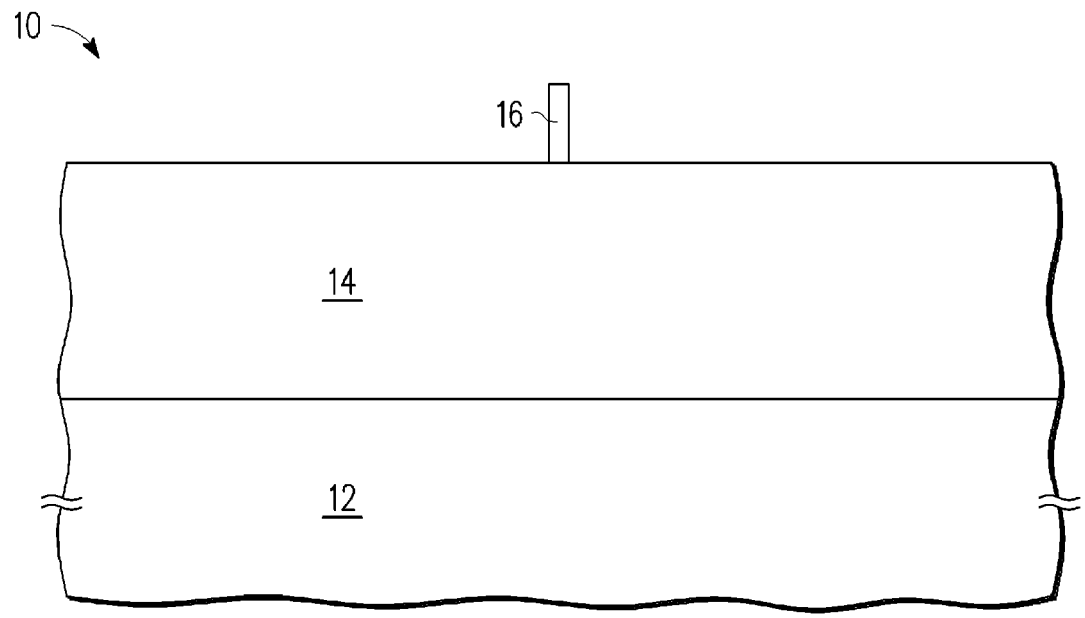

Illustrated in FIG. 5 is further processing of semiconductor device 10. The remaining portion of polysilicon 16 is further thinned by performing a dry oxidation followed by a conventional oxide wet etch to remove this grown oxide. A succession of such oxidation and wet etch treatments are performed until the remaining portion of polysilicon 16 has a width approximately in a range of 50 to 150 Angstroms. This thinning results in a dimension that is below or sub-lithographic dimensions and thus enables the providing of a very compact split gate memory cell.

Figure 6:
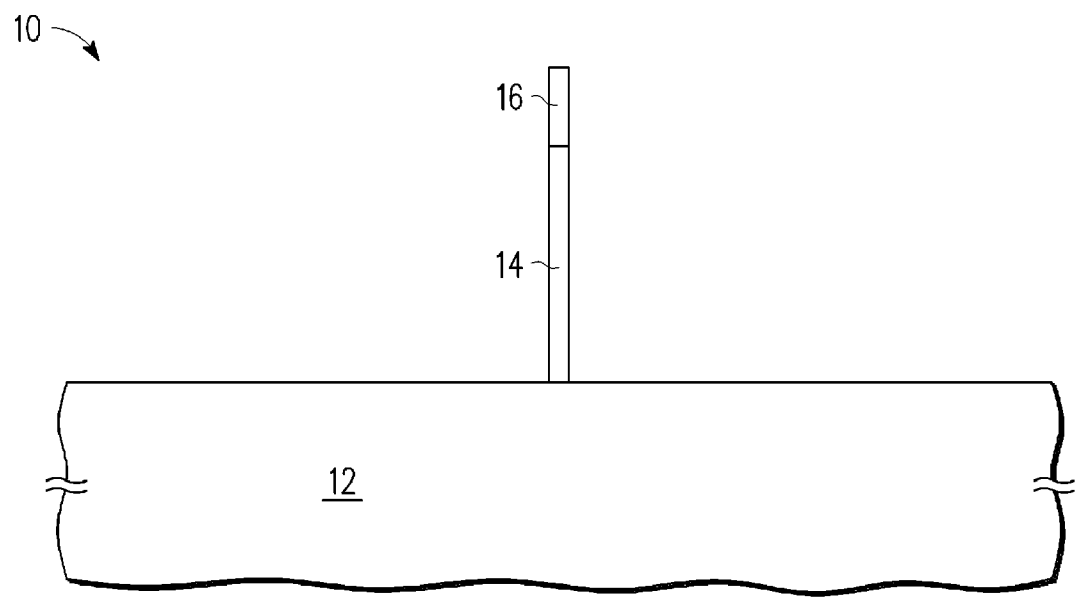

Illustrated in FIG. 6 is further processing of semiconductor device 10 wherein exposed portions of the thermal oxide 14 are etched. The remaining portion of polysilicon 16 functions as a mask to form a narrow remainder of the thermal oxide 14 immediately below. This narrow remainder is herein referred to as a pillar. All exposed portions of the thermal oxide 14 are removed to expose an upper surface of the semiconductor substrate 12. In one form a dry etch of the thermal oxide 14 is implemented.

Figure 7:
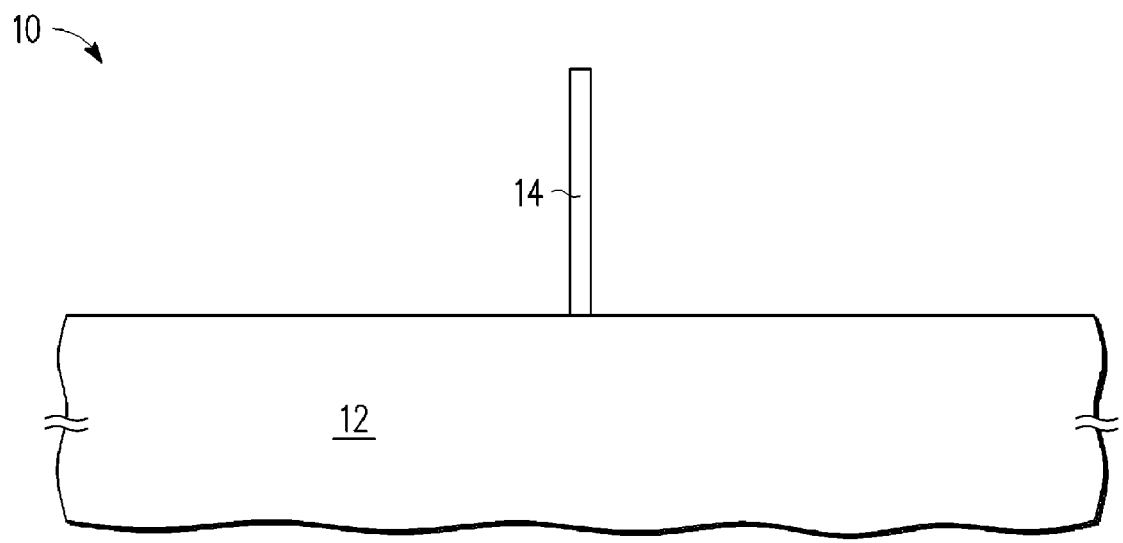

Illustrated in FIG. 7 is further processing of semiconductor device 10 wherein a conventional dry etch is performed to remove the remaining portion of polysilicon 16. As a result, the pillar described above is formed on the semiconductor substrate 12. The pillar may also be considered as a fin.

Figure 8:
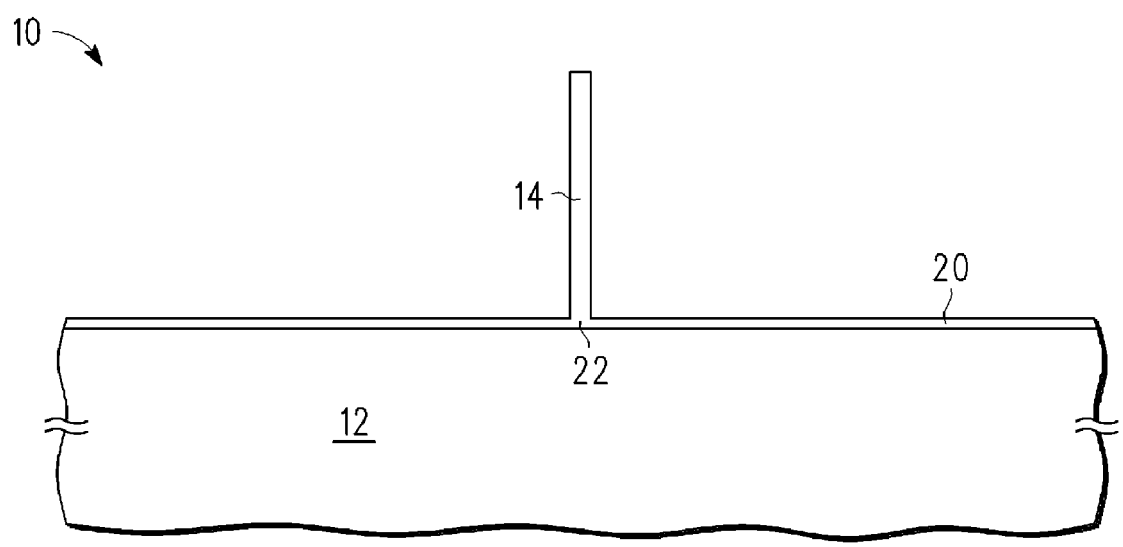

Illustrated in FIG. 8 is further processing of semiconductor device 10 wherein a gate dielectric in the form of a thin oxide 20 is thermally grown. The thin oxide 20 merges with the dielectric material of thermal oxide 14 at a region 22. Thus the size (i.e. height and width) of the fin structure of thermal oxide 14 increases somewhat from FIG. 7 to FIG. 8. It should be understood that because the thermal oxide 14 was thermally grown as well as thin oxide 20, both materials are the same quality of dielectric or insulating material. The use of a thermally grown oxide is also preferable to the use of a deposited oxide as thermally grown oxides exhibit better insulating properties than deposited oxides.

Figure 9:
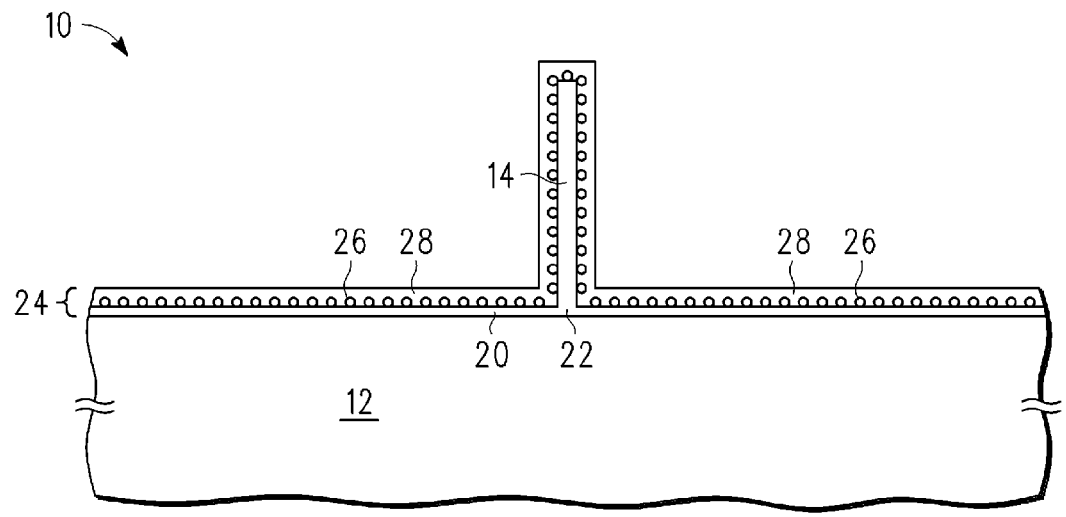

Illustrated in FIG. 9 is further processing of semiconductor device 10 wherein a charge storage layer 24 is formed overlying the thin oxide 20 and exposed surfaces of the thermal oxide 14 that forms a fin. In other words, the charge storage layer 24 forms on all sides or sidewalls of the thermal oxide 14 as well as on a top surface of the thermal oxide 14. The charge storage layer 24 may be implemented using any of various types of charge storage materials. In the illustrated form the charge storage layer 24 is implemented using a plurality of silicon nanocrystals 26 surrounded by a high temperature oxide 28 (HTO). The nanocrystals 26 are typically about 70 Angstroms in diameter and the insulating layer is about 140 Angstroms in thickness. The high temperature oxide 28 is formed by an oxide deposition. It should be understood that the term nanocrystals as used herein includes charge trapping particles that are not necessarily crystalline in structure and thus includes the term nanoclusters that is also used in the literature. Additionally, nanocrystals include particles of varying size and shape and are not necessarily spherical. For example various non-circular shapes are formed when depositing silicon nanocrystals. The plurality of silicon nanocrystals 26 is deposited at a single atom depth. In other forms it should be well understood that the charge storage layer 24 may be implemented using other charge storage materials such as by using a layer of nitrided material such as silicon nitride. It should be noted that the region 22 is devoid of the presence of any charge storage material. Also, the vertical fin that is formed from thermal oxide 14 contains a gap that separates the charge storage layer 24 present on the side surfaces of the thermal oxide 14.

Figure 10:
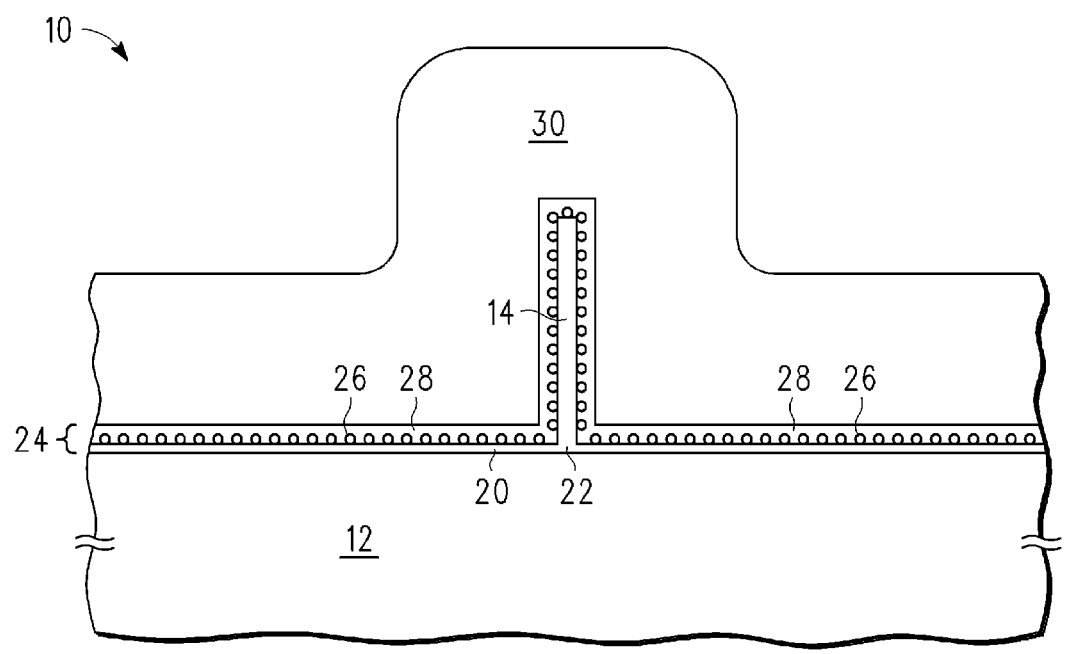

Illustrated in FIG. 10 is further processing of semiconductor device 10 wherein a conformal layer of polysilicon 30 is deposited overlying the charge storage layer 24. The layer of polysilicon 30 is deposited to a thickness that is sufficient to subsequently form sidewall spacers adjacent the fin structure formed by the thermal oxide 14. The thickness of the layer of polysilicon 30 determines the length of a control gate and a select gate to be subsequently formed. This length can be made to be smaller than the smallest feature size that can be lithographically printed by controlling the thickness of the layer of polysilicon 30. If a small amount of the layer of polysilicon 30 is deposited, a sublithographic dimensioned sidewall spacer may be subsequently formed. The layer of polysilicon 30 may be doped in-situ during deposition or ex-situ by ion-implantation immediately after deposition.

Figure 11:
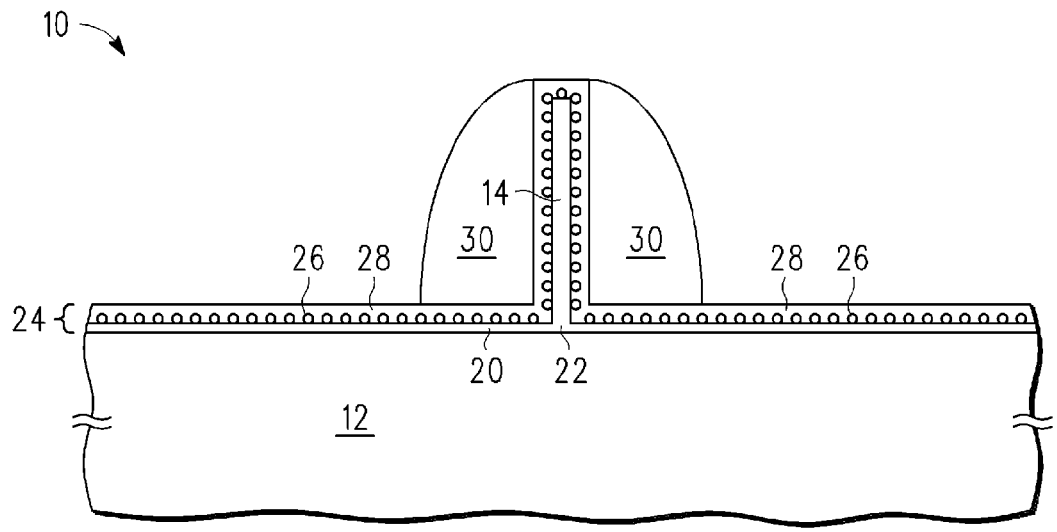

Illustrated in FIG. 11 is further processing of semiconductor device 10 wherein a reactive ion etch (RIE) of the layer of polysilicon 30 is performed. This etch is a conventional dry etch and is commonly implemented to form sidewall spacer structures. Thus the details of the etch will not be provided. Remaining portions of the layer of polysilicon 30 exist only adjacent the fin structure formed by the thermal oxide 14. The reactive ion etch does not remove or adversely affect any of the exposed surfaces of the charge storage layer 24.

Figure 12:
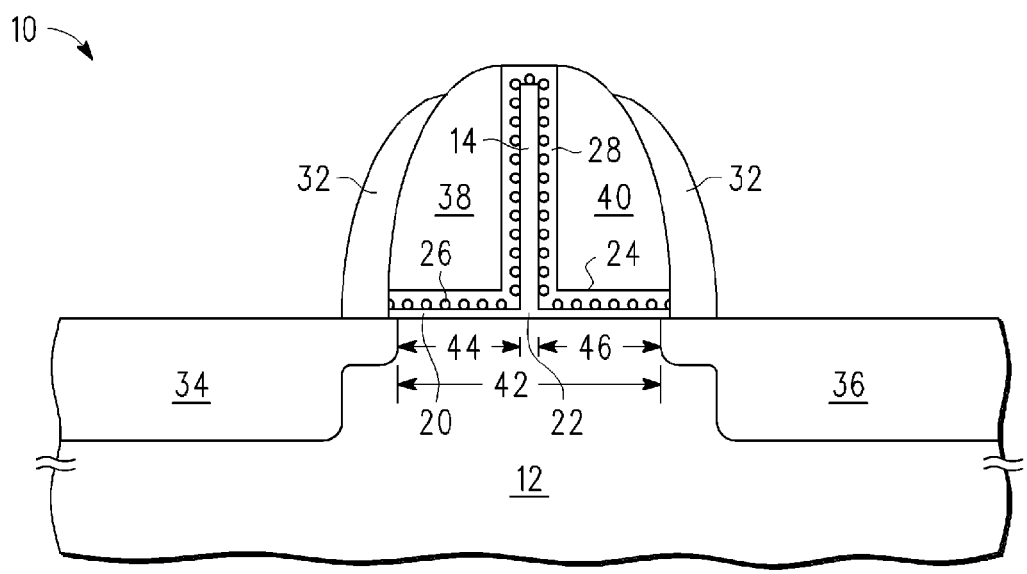

Illustrated in FIG. 12 is further processing of semiconductor device 10 wherein extension portions of a source 34 and a drain 36 are formed within the semiconductor substrate 12 by a conventional ion implantation. However, in a first step, the spacer formed from the layer of polysilicon 30 is physically divided into a select gate 38 and a control gate 40 by a conventional dry etch with a photomask used to protect desired remainder portions of the spacer material formed from the layer of polysilicon 30. Subsequent to the formation of extension portions, a nitride sidewall spacer 32 is formed by a deposition step and subsequent etch step along all exposed surfaces of the select gate 38, the control gate 40 and the fin structure formed by the thermal oxide 14. In one form the nitride sidewall spacer 32 is formed of silicon nitride. Once the nitride sidewall spacer 32 is in place, a second ion implantation is performed to complete the formation of source 34 and drain 36. In the illustrated form a channel 42 is formed between the source 34 and the drain 36. The channel 42 has a first portion 44 that underlies the select gate 38 and a second portion 46 that underlies the control gate 40.

It should be noted that the plurality of nanocrystals 26 underneath the select gate 38 does not adversely impact the performance of the memory cell because the select gate 38 is not exposed to high voltages required to inject charge into the charge storage layer 24. As a result, the threshold voltage of the first portion 44 of the channel under the select gate 38 is not influenced by the nanocrystals. In contrast, the nanocrystals underlying the control gate 40 can be programmed with electrons from the underlying second portion 46 of the channel under the influence of the high voltages seen on control gate 40 that occur during a program operation of the memory cell. The high voltage applied to the control gate 40 induces charge transfer (either hot carrier or electron tunneling) between the nanocrystals and the second portion 46 of the channel. These nanocrystals perform the function of a charge storage element in the memory device thereby influencing the threshold voltage of the second portion 46 of the channel under the control gate 40. It should be noted that the semiconductor device 10 of FIG. 12 has a structure that has an "inverted T" or inverse-T shape having lower first and second horizontal portions that are formed by the fin structure of thermal oxide 14 and the charge storage layer 24.

By now it should be appreciated that there has been provided a method and a split gate memory cell structure that is very compact while minimizing the number of mask layers that are required. The compact size utilizes sublithographic feature sizes which improve the efficiency of programming operations by having smaller control gate channel length. With improved programming efficiency, lower program voltages may be used which in turn permit further reduction of voltage specifications for devices which supply the program voltage. The split gate memory cell described herein may also be readily scaled to smaller dimensions by reducing the thickness of the polysilicon layer 30 to create sub-lithographic select and control gates for a memory cell. The split gate memory cell described herein is self-aligned meaning that the outer edges of both the control gate and the select gate are defined in a single process step that allows the source and drain regions to be simultaneously aligned to these outer edges. Further, the device is symmetric in that the source and the drain terminals may be reversed, if needed.

In one form there is herein provided a method of forming a split gate memory device in and on a semiconductor layer such as a substrate or a semiconductor on an insulator. An insulating layer is formed over the semiconductor layer. The insulating layer is patterned to leave a pillar of insulating material, wherein the pillar has a first side and a second side. A gate dielectric is formed over the semiconductor layer. A charge storage layer is formed over the gate dielectric and along the first and second sides of and over the pillar. After forming the charge storage layer, a gate material layer is formed over the gate dielectric and the pillar. An etch is performed to leave a first portion of the gate material laterally adjacent to a first side of the pillar and over a first portion of the charge storage layer that is over the gate dielectric to function as a control gate of the memory device. A second portion of the gate material is laterally adjacent to a second side of the pillar and over a second portion of the charge storage layer that is over the gate dielectric to function as a select gate. Source/drain regions are formed in the semiconductor layer spaced apart to form a channel under the first and second portions of the gate material. In one form forming the insulating layer includes performing a first step of thermal oxidation. In another form the gate dielectric includes performing a second step of thermal oxidation. In yet another form forming the gate material layer includes depositing polysilicon. In another form the charge storage layer is formed by forming nanocrystals. The nanocrystals are surrounded with a layer of oxide. In yet another form the charge storage layer is formed by depositing nitride and an overlying oxide. In yet another form patterning the insulating layer includes depositing a sacrificial layer and patterning the sacrificial layer to form a sacrificial pillar of a first width. The sacrificial layer is thinned to reduce the sacrificial pillar to a second width less than the first width. In yet another form patterning the sacrificial layer includes depositing a layer of photoresist on the sacrificial layer and patterning the layer of photoresist to form a pillar of photoresist of a third width. The pillar of photoresist is thinned to reduce the pillar of photoresist to a fourth width less than the third width. In yet another form the sacrificial layer includes polysilicon. In another form the source/drain regions are formed by performing an implant using the first and second portions of the gate material as a mask. In yet another form the source/drain regions are formed by forming a sidewall spacer adjacent to the first and second portions of the gate material. A second implant is made using the sidewall spacer as a mask.

In yet another form there is herein provided a method of forming a split gate memory device in and on a semiconductor layer. A pillar of insulating material is formed over the semiconductor layer having a first side and a second side. A charge storage layer is formed over and along the first and second sides of the pillar and over the semiconductor layer. A substantially conformal layer of gate material is deposited over the charge storage layer. An anisotropic etch is performed on the substantially conformal layer so that first sidewall spacers of the gate material are formed adjacent to the first and second sides of the pillar of insulating material. A first implant is performed into the semiconductor layer using the first sidewall spacers as a mask. Second sidewall spacers are formed adjacent to the first sidewall spacers. A second implant is performed into the semiconductor layer using the second sidewall spacers as a mask. In another form the pillar is formed by performing a step of thermal oxidation on the semiconductor layer to from an insulating layer. A sacrificial layer is deposited. The sacrificial layer is patterned to form a patterned portion of the sacrificial layer. The insulating layer is etched using the patterned portion as a mask. In another form patterning the sacrificial layer is implemented by forming a layer of photoresist over the sacrificial layer. A pillar of photoresist is formed. The pillar of photoresist is thinned. An etchant is applied to the sacrificial layer after thinning the pillar of photoresist. The pillar of photoresist is removed and after applying the etchant, thinning is performed to form the patterned portion of the sacrificial layer. In yet another form the sacrificial layer is deposited by depositing polysilicon. In yet another form thermal oxidation is formed on the semiconductor layer prior to forming the charge storage layer.

In yet another form there is herein provided a split gate memory device in and on a semiconductor layer. An inverse-T insulating structure on the semiconductor layer has lower first and second horizontal portions and a vertical portion extending from the horizontal portions away from the semiconductor layer. A charge storage layer coats top surfaces of the first and second horizontal portions and first and second sides of the vertical portion. A control gate is formed over the first horizontal portion. A select gate is formed over the second horizontal portion and separated from the control gate by the charge storage layer on the first side of the vertical portion, the vertical portion, and the charge layer on the second side of the vertical portion. A channel region in the semiconductor layer is under the first and second horizontal portions and the vertical portion. Source/drain regions are in the semiconductor layer on opposite sides of the channel. In another form the inverse-T insulating structure is an oxide. In yet another form the charge storage layer is a plurality of nanocrystals embedded in an insulating layer. In yet another form the charge storage layer is nitride with an overlying oxide.

The terms "front," "back," "top," "bottom," "over," "under," "lower," "upper" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, metal gates and compound metal gates may be implemented in lieu of the polysilicon control gate 40 and polysilicon select gate 38. Various dielectric materials may be used in lieu of the specific insulators that are detailed. For example, instead of using a gate silicon oxide insulator, a high K dielectric material may be used. Instead of the sacrificial layer of polysilicon 16, another material which can function as a hard mask when etching oxide and which can etched selective to the underlying thermal oxide 14 may be used. When implementing the memory cell described herein in an array, additional size savings may be implemented by utilizing symmetry of the cell layout for adjacent memory devices. For example, two adjacent memory cells may utilize a common source/drain electrode with a single electrical contact.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of forming a split gate memory device in and on a semiconductor layer, comprising:
    forming an insulating layer over the semiconductor layer;
    patterning the insulating layer to leave a pillar of insulating material, wherein the pillar has a first side and a second side;
    forming a gate dielectric over the semiconductor layer;
    forming a charge storage layer over the gate dielectric and along the first and second sides of and over the pillar;
    after forming the charge storage layer, forming a gate material layer over the gate dielectric and the pillar;
    performing an etch to leave a first portion of the gate material layer laterally adjacent to a first side of the pillar and over a first portion of the charge storage layer that is over the gate dielectric to function as a control gate of the memory device and a second portion of the gate material layer laterally adjacent to a second side of the pillar and over a second portion of the charge storage layer that is over the gate dielectric to function as a select gate; and
    forming source/drain regions in the semiconductor layer spaced apart to form a channel under the first and second portions of the gate material layer.

2. The method of claim 1, wherein the step of forming the insulating layer comprises performing a first step of thermal oxidation.

3. The method of claim 2, wherein the step of forming the gate dielectric comprises performing a second step of thermal oxidation.

4. The method of claim 1, wherein the step of forming the gate material layer comprises depositing polysilicon.

5. The method of claim 1, wherein the step of forming the charge storage layer comprises:
    forming nanocrystals; and
    surrounding the nanocrystals with a layer of oxide.

6. The method of claim 1, wherein the step of forming the charge storage layer comprises depositing nitride.

7. The method of claim 1, wherein the step of patterning the insulating layer, comprises:
    depositing a sacrificial layer,
    patterning the sacrificial layer to form a sacrificial pillar of a first width; and
    thinning the sacrificial layer to reduce the sacrificial pillar to a second width less than the first width.

8. The method of claim 7, wherein the step of patterning the sacrificial layer, further comprises:
    depositing a layer of photoresist on the sacrificial layer;
    patterning the layer of photoresist to form a pillar of photoresist of a third width; and
    thinning the pillar of photoresist to reduce the pillar of photoresist to a fourth width less than the third width.

9. The method of claim 7, wherein the step of patterning the insulating layer is further characterized by the sacrificial layer comprising polysilicon.

10. The method of claim 1, wherein the step of forming source/drain regions comprises performing an implant using the first and second portions of the gate material layer as a mask.

11. The method of claim 10, wherein the step of forming source/drain regions further comprises:
    forming a sidewall spacer adjacent to the first and second portions of the gate material layer; and
    performing a second implant using the sidewall spacer as a mask.

12. A method of forming a split gate memory device in and on a semiconductor layer, comprising:
    forming a pillar of insulating material over the semiconductor layer having a first side and a second side;
    forming a charge storage layer over and along the first and second sides of the pillar and over the semiconductor layer;
    depositing a substantially conformal layer of gate material over the charge storage layer;
    performing an anisotropic etch on the substantially conformal layer so that first sidewall spacers of the gate material are formed adjacent to the first and second sides of the pillar of insulating material;
    performing a first implant into the semiconductor layer using the first sidewall spacers as a mask;
    forming second sidewall spacers adjacent to the first sidewall spacers; and
    performing a second implant into the semiconductor layer using the second sidewall spacers as a mask.

13. The method of claim 12, wherein the step of forming the pillar comprises:
    performing a step of thermal oxidation on the semiconductor layer to form an insulating layer;
    depositing a sacrificial layer;
    patterning the sacrificial layer to form a patterned portion of the sacrificial layer; and
    etching the insulating layer using the patterned portion as a mask.

14. The method of claim 13, wherein the step of patterning the sacrificial layer comprises:
    forming a layer of photoresist over the sacrificial layer;
    forming a pillar of photoresist;
    thinning the pillar of photoresist,
    applying an etchant to the sacrificial layer after the step of thinning the pillar of photoresist;
    removing the pillar of photoresist; and
    after the step of applying the etchant, performing thinning to form the patterned portion of the sacrificial layer.

15. The method of claim 14, wherein the depositing the sacrificial layer comprises depositing polyslicon.

16. The method of claim 12, further comprising performing a step of thermal oxidation on the semiconductor layer prior to the step of forming the charge storage layer.

* * * * *

UNITED STATES PATENT AND TRADEMARK OFFICE
CERTIFICATE OF CORRECTION

| | | |
|---|---|---|
| PATENT NO. | : 7,528,047 B2 | Page 1 of 1 |
| APPLICATION NO. | : 11/759593 | |
| DATED | : May 5, 2009 | |
| INVENTOR(S) | : Rao et al. | |

It is certified that error appears in the above-identified patent and that said Letters Patent is hereby corrected as shown below:

Column 8, line 48, in Claim 14, delete "photoresist," and insert -- photoresist; --.

Column 8, line 55, in Claim 15, "polyslicon." and insert -- polysilicon. --.

Signed and Sealed this
Sixteenth Day of August, 2011

David J. Kappos
*Director of the United States Patent and Trademark Office*